BATCH FABRICATION ARRANGEMENT FOR INTEGRATED CIRCUITS

Filed April 10, 1967 2 Sheets-Sheet 1

INVENTOR
LESTER W. SPANDORFER
BY William E. Cleaver
ATTORNEY

BATCH FABRICATION ARRANGEMENT FOR INTEGRATED CIRCUITS

Filed April 10, 1967

| W | X | Y | C |
|---|---|---|---|
| 0 | 1 | 0 | 0 |
| 0 | 1 | 1 | $\bar{A}B$ |
| 1 | 0 | 1 | A+B |
| 1 | 1 | 0 | $A\bar{B}$ |
| 1 | 1 | 1 | $\bar{A}B+A\bar{B}$ |

INVENTOR
LESTER W. SPANDORFER

BY William E. Cleaver
ATTORNEY

United States Patent Office 3,531,662
Patented Sept. 29, 1970

3,531,662
BATCH FABRICATION ARRANGEMENT FOR INTEGRATED CIRCUITS

Lester M. Spandorfer, Cheltenham, Pa., assignor to Sperry Rand Corporation, New York, N.Y., a corporation of Delaware Filed Apr. 10, 1967, Ser. No. 629,679
Int. Cl. H03k *19/36*
U.S. Cl. 307—303 1 Claim

ABSTRACT OF THE DISCLOSURE

The present invention provides an arrangement whereby logic elements can be fabricated in relatively large numbers on a semiconductor wafer and thereafter connected together in some standard fashion to accomplish a plurality of logic functions depending upon the presence of certain control signals. The invention provides a shift register, with or without the combination of a decoder, to provide the control signals to the logic elements. The use of the shift register enables a minimum number of lead-in wires to be connected to the wafer. Because of the nature of the combination of the shift register, with or without the decoder, a large number of control signals can be generated and therefore a large number of combinations of logic functions can be accomplished by one standard set of logic elements.

This invention relates to integrated circuits, and more particularly to a logic arrangement thereof which would permit batch fabrication of such circuits.

BACKGROUND

With the introduction of large scale integrated circuits, commonly referred to as LSI circuits, there arises the problem of how to employ batch fabrication and still maintain some degree of flexibility with respect to the individual elements. In other words, when a wafer is fabricated to include a large number of logic elements, for instance NAND gates, and these NAND gates are connected in any particular fashion to accomplish some particular objective, the system loses its appeal when it becomes apparent that there is some more desirable arrangement of the logic than has been fabricated or in fact part of the logic is faulty. In these last-mentioned sets of circumstances it would seem that if the change in design were sufficiently desirable it would be necessary to discard the wafer and substitute a new wafer with the new arranged logic therefor. Clearly such a practice would not help low production costs and hence is an undesirable practice.

SUMMARY

The present invention provides a means to add flexibility into a batch fabrication procedure. By virtue of the present invention, the logic elements which are fabricated on a wafer, in large numbers, are connected together in such a fashion that if they are properly controlled they can handle input systems thereto to selectively provide any one of a number of logic functions. Since the nature of the integrated circuit art is such that the circuits are physically very small it is quite necessary to strive for the minimum of input leads or output leads which make contact with other parts of the system. Accordingly, in the present invention the control words, which set up the particular mode in which the logic will operate during a given time, are fed to the system with only two input lines while accomplishing a number of control conditions. The number of control conditions is commensurate with the stages of the shift register into which the control word is inserted.

The features and novelties of the present invention will be better understood when the following specification is considered in conjunction with the drawings wherein.

Figure 1:
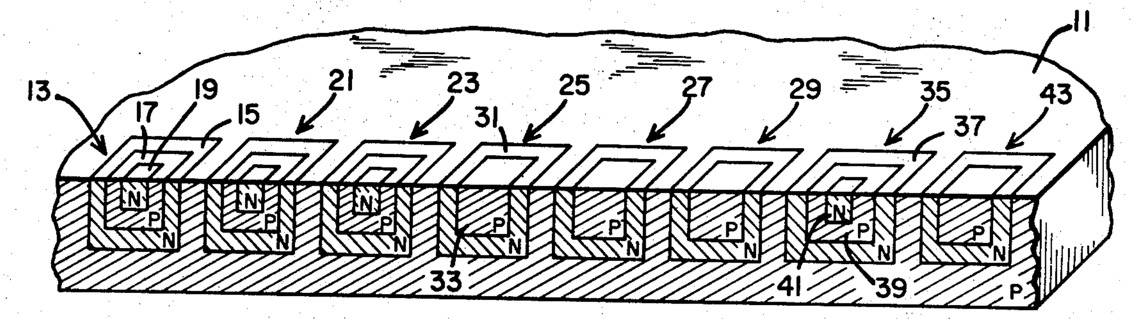
FIG. 1 shows a cross section of a wafer with the elements of a NAND gate diffused therein.

Consider FIG. 1 which shows a cross section of a semiconductor wafer into which other materials have been diffused to form integrated circuit elements. In FIG. 1 there is depicted a wafer 11 of P type material. The wafer can be any type of semiconductor material which displays a "P material" characteristic, but in the preferred embodiment it is fabricated from silicon. In accordance with well known techniques for fabricating integrated circuits, which techniques can be found, among other places, in a textbook entitled, "Integrated Circuit Engineering," published by Boston Technical Publications, Inc., Cambridge, Mass. 1966, other types of material are diffused into the P wafer 11 to form the particular components to be used in a logic circuit. For instance the element 13 which is shown at the far most left of FIG. 1, is a diode. Initially in order to effect the diode there is diffused therein some N type material. The layer 15 depicts the N material which is used to provide an isolation barrier between the P material of the wafer and the P material of the diode. Into the N material there is further diffused P material, the layer 17 representing the same. Finally, into this last-mentioned layer P material there is diffused some N material represented by the layer 19. The P material 17 and the N material 19 comprise the necessary elements to provide a diode and the input circuit can be connected from N to P or from P to N depending upon which way the diode is to be poled.

Into the wafer 11 there are further fabricated two diodes 21 and 23 whose construction is the same as that of diode 13 and therefore need not be explained any further.

Adjacent to the diode 23 there are depicted (in FIG. 1) three resistor elements 25, 27 and 29. The resistor elements are made up by first diffusing N material, such as the layer 31, into the P wafer and thereafter diffusing P material, such as the layer 33, into the N material. The N material acts as an isolation means, while the input and the output are connected to the P material. The resistor elements 27 and 29 are obviously fabricated in this same manner.

Adjacent to the resistor element 29 there is fabricated a transistor 35. As can be seen in FIG. 1 the transistor 35 is made up by diffusing N material, such as layer 37, into the P wafer. Thereafter P material is diffused into the N layer 37. This is depicted by the P layer 39. Thereafter an N layer 41 is diffused into the P material. Terminals are connected to the N layer 41, the P layer 39, and the N layer 37 to make up an NPN transistor.

Finally, adjacent to transistor 35 there is fabricated a resistor element 43 to which the output means is connected. The resistor 43 is fabricated in the same manner as described in connection with resistor 25. The schematic circuit shown in FIG. 4 gives some indication of the layout of the three diodes 13, 21 and 23, the resistors 25, 27, 29 and 43, as well as the transistor 35.

Figure 2:
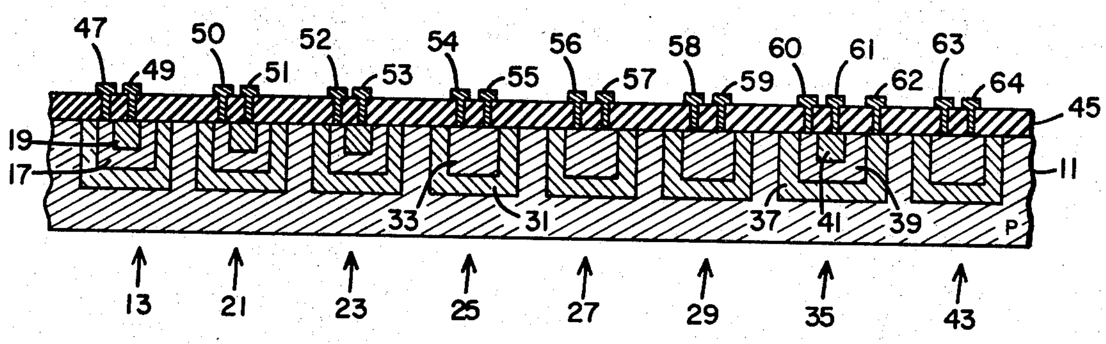
FIG. 2 is a side view of the wafer of FIG. 1 with the further addition of an oxide coating thereon and lead terminals disposed thereon.

FIG. 2 shows the P wafer 11 along with the diodes 13, 21 and 23, as well as the resistors 25, 27, 29, and 43 and the transistor 35. On the upper surface of the wafer 11 as shown in FIG. 2 there has been deposited a silicon oxide layer 45. The deposition of this oxide layer 45 is also taught in the above-mentioned textbook, "Integrated Circuit Engineering," and other typical texts. By the chemical techniques used for depositing and etching, the terminal leads shown in FIG. 2 are formed and deposited at the proper locations with the elements shown therein. For instance, by use of a photo resist and then a photo etch technique, the terminal 47 is formed through the oxide layer 45 and deposited to come in contact with the P layer 17. In a similar fashion the lead terminal 49 is formed through the oxide 45 and deposited to come in contact with the N material 19. The remainder of the lead terminals shown in FIG. 2 are similarly formed and are numbered for identification in connection with FIG. 3.

Consider now FIG. 3 which shows the lead terminals described in connection with FIG. 2 and which are further connected to one another to form the NAND gate depicted, schematically, in FIG. 4. It will be noted that that inputs to the diodes 13, 21 and 23 are connected to the N material so that the diode will be poled as shown in FIG. 4. The anodes of the diodes are connected to a common line 65 which is further connected to the two resistors 25 and 27, respectively, through terminals 54 and 56. The other side of the resistor 25 through the lead terminal 55 is connected to the positive voltage potential by virtue of the line 66. The other side of the resistor 27, through the lead terminal 57, is connected to the one terminal of resistor 29 and also to the base of transistor 35. The other side of resistor 29, through the terminal 59, is connected to the negative voltage potential by virtue of the line 67. The emitter of transistor 35 is connected, through the lead line 61, to the negative potential by virtue of the line 67. The collector of the transistor 35, through the lead line 62, is connected to one terminal of the resistor 43 and also to the output line 68. The other side of the resistor 43 through the lead terminal 64 is connected back to the positive potential through the line 66.

Figure 3:
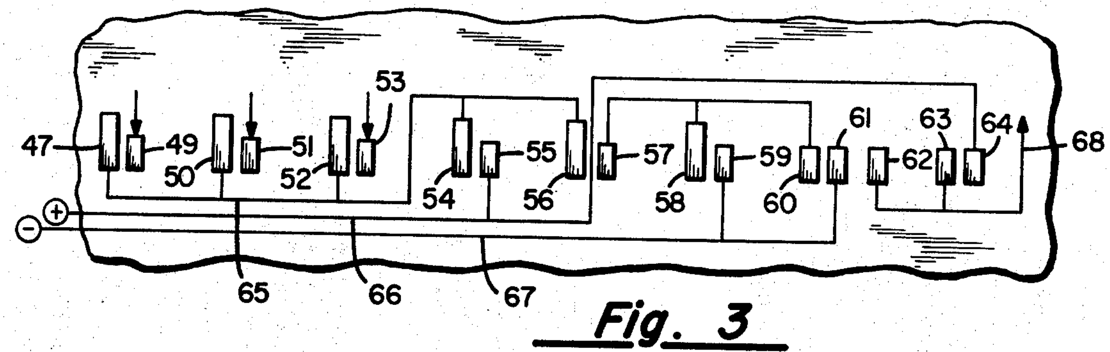
FIG. 3 is a top plane view of FIG. 2 with the further connections necessary to combine the elements into an active NAND gate.
Figure 4:
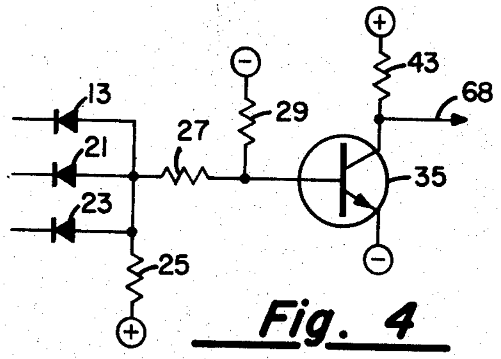
FIG. 4 is a schematic of the NAND gate.

It becomes apparent then that the elements of a NAND gate such as that shown in FIG. 4 can be readily fabricated in a P wafer as shown in FIGS. 1 and 2 and can be further connected by a printed circuit arrangement as shown in FIG. 3 using a photoresist technique to connect the elements so that the combination operates as a NAND gate. It should also be equally apparent the other type of logic devices can be similarly fabricated to provide NOR gates, AND gates, OR gates and the like.

Figure 5:
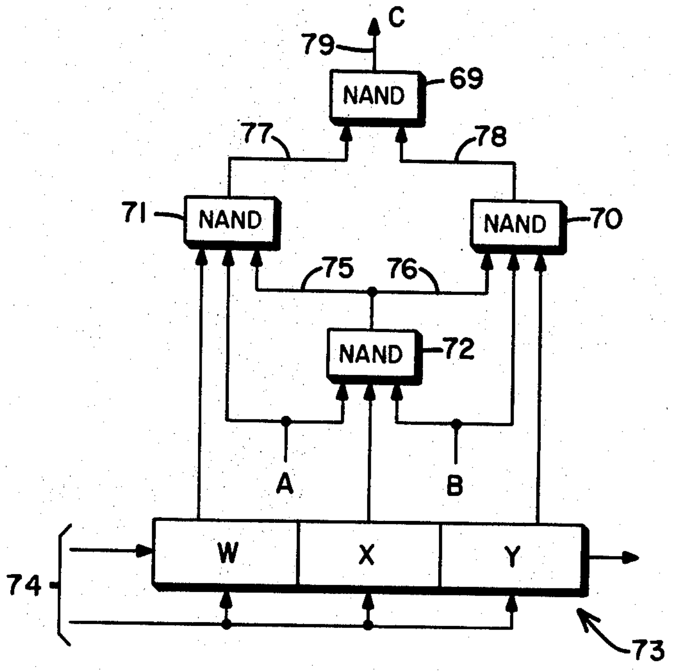
FIG. 5 depicts schematically a group of NAND gates arranged to accomplish at least five functions depending upon the control words entered into the shift register associated therewith.

Consider now FIG. 5 which shows four NAND gates preferably of the kind fabricated in accordance with the FIGS. 1, 2 and 3. Connected to the NAND gates 69, 70, 71 and 72 is a shift register 73. The shift register 73 is shown with three stages and it should be understood that this shift register might be any number of stages and might be connected to service any number of NAND gates or other logic elements. The shift register might be any well known type shift register, made up of flip-flops and AND gates or similar logic construction, and in particular could be of the type shown on page 102 of the text "Digital Computer Fundamentals" by Thomas C. Bartee, published by McGraw-Hill, 1960. While the shift register shown in this last-mentioned text has two input signal lines which carry data as well as a shift signal line, in actual practice one of the two data input lines could pass through an inverter. Accordingly, there would be only two input lines to the shift register, one to carry the control word and one to carry a shift signal and hence there would be only two control lines to the "outside world" or extending from the logic. Such lines would be connected to some other logic block, or an input device, or a memory device or some device which is supplying control signals to the integrated circuitry.

In FIG. 5 there are shown two logic input terminals A and B as well as one logic output terminal C. The logic input terminals A and B accept data signals which are to be processed through the particular logic to which they are connected and these signals may come from other logic elements of the integrated circuit arrangement. On the other hand, these input signals may also come from the "outside world."

Adjacent to the circuitry of FIG. 5 there is a truth table which shows a variety of control words which can be sent into the shift register in accordance with the stages WXY. In other words, if the control word 1–0–1 were transmitted on the input channel 74 the register would read 1–0–1 in the W, X, Y stages respectively. This being the condition and further assuming that the ground rules are that the NAND gates become permissive in response to "ONE" signals, we find that the NAND gates 71 and 72 are partially conditioned for a zero output by virtue of the ONE in the W stage and the ONE in the Y stage. Since the X stage is a zero, we can also conclude that there will be a ONE signal present on lines 75 and 76. Hence the NAND gates 71 and 70 are respectively subjected to a second signal which will render these gates able to provide an output. Now finally if there is a ONE transmitted to either of the terminals A or B, the respective NAND gates 71 and 70 will become fully conditioned to provide a zero output and it will be transmitted on either line 77 or 78. Accordingly, if either an A or a B signal is present, the NAND gate 69 will not be fully conditioned to provide a zero output and hence the output signal on line 79 will be a ONE. Accordingly, the truth table indicates that C will represent either A or B depending on the data input when the control word is 1–0–1. The other portions of the truth table can be easily worked out.

Now it becomes readily understandable that a large shift register can be provided and can be loaded in accordance with the proper control words such that the NAND gates (or whatever other logic elements may be used) perform the function which is necessary to accomplish any even operation. In this way the integrated circuits can be back fabricated by only connecting the NAND gates internally as they should be properly connected and secondly connecting the NAND gates to one another in a very general fashion. If as time elapses the logic designer finds a more economical method (in either a monetary or a time sense) to connect the NAND gates, then these NAND gates can be simply so connected by virtue of the control words which are entered into the shift register. Again it should be emphasized that a great advantage here is that the flexibility which comes from being able to simply enter control words into the shift register is accomplished by simply providing two input lines from the source of the control words.

Figure 6:
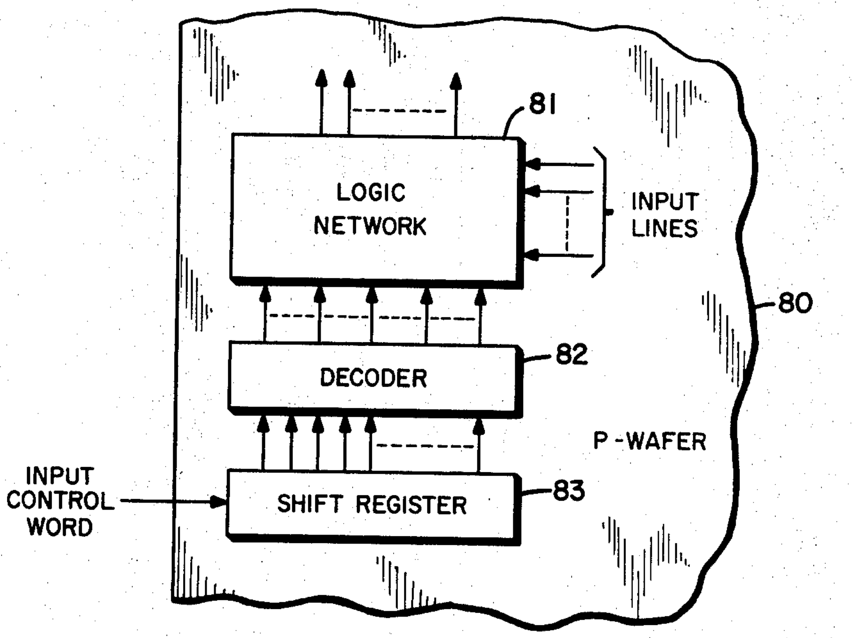
FIG. 6 depicts schematically an overall arrangement including a decoder in combination with the shift register.

FIG. 6 shows a P wafer 80 which is similar to the P wafer 11 upon which there has been fabricated a logic network 81. Logic network 81 may be composed of a number of NAND gates, inverters, flip-flops, etc., and these logic elements are all connected in a general fashion to accomplish a number of logic functions depending upon signals generated. Connected to the logic network 81 is a decoder 82. The decoder 82 may be one of the any well known diode type matrices which enables one to put in a plurality of signals and generate one output signal or some other combination of inputs and outputs. Connected to the decoder 82 is a shift register 83 which is of the same type shift register as described in connection with shift register 73. By including the decoder between the shift register and the logic network it is possible that for any given number of inputs, more control signals can be generated and hence there is greater flexibility than that which is described in connection with FIG. 5.

It should be understood that the decoder would also be part of the integrated circuit fabrication, it being simply made up of a plurality of diffused diodes and printed circuit lines.

The embodiments of the invention in which an exclusive property or privilege is claimed are defined as follows:

1. A logic circuit arrangement employing integrated circuit means comprising the combination of:

(a) a plurality of integrated circuit elements;

(b) certain of said integrated circuit elements connected to certain others of said integrated circuit elements to form at least first, second, third and fourth logic circuit NAND gates each of which has input and output means;

(c) certain others of said integrated circuit elements connected to still certain others of said integrated circuit elements to form a multiple stage shift register having at least first, second, and third stages into which there can be entered control words to cause said stages to be conducting or nonconducting;

(d) first circuitry means connecting said first stage of said shift register to the input means of said first NAND gate and said second stage of said shift register to the input means of said second NAND gate and said third stage of said shift register to the input means of said third NAND gate;

(e) second circuitry means connecting the output means of said second NAND gate to the input means of said first and third NAND gates;

(f) third circuit means connecting the output means of said first and third NAND gates to the input means of said fourth NAND gate;

(g) fourth circuitry means connecting logical input signals to the input means of said first, second and third NAND gates whereby when control words are entered into said shift register a number of different logical functions can be determined at the output means of said fourth NAND gate depending upon the combination of conducting and alternatively nonconducting conditions of said stages of said shift register.

References Cited

UNITED STATES PATENTS

| | | | |
|---|---|---|---|
| 3,281,527 | 10/1966 | Davis et al. | 307—221 X |
| 3,309,537 | 3/1967 | Archer | 307—303 X |
| 3,371,221 | 2/1968 | Onuma et al. | 307—215 X |
| 3,402,330 | 9/1968 | Archer | 307—213 X |
| 3,407,357 | 10/1968 | Spandorfer et al. | 307—216 X |
| 3,417,260 | 12/1968 | Foster | 307—215 X |

OTHER REFERENCES

Smith et al.: I.B.M. Technical Disclosure Bulletin, vol. 6, No. 4, 9–63, pp. 67, 68.

Solomon: Integrated Circuits, Electronics World, vol. 72, No. 3, 9–64, pp. 27–32.

STANLEY D. MILLER, Primary Examiner

J. D. FREW, Assistant Examiner

U.S. Cl. X.R.

307—207, 215, 216, 221; 328—93